US012804915B2

(12) United States Patent
Ritter et al.

(10) Patent No.: US 12,804,915 B2
(45) Date of Patent: Nov. 17, 2026

(54) ELECTROSTATIC DISCHARGE PROTECTION SEMICONDUCTOR STRUCTURE AND A METHOD OF MANUFACTURE

(71) Applicant: NEXPERIA B.V., Nijmegen (NL)

(72) Inventors: Hans-Martin Ritter, Nijmegen (NL); Andreas Zimmerman, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 17/381,659

(22) Filed: Jul. 21, 2021

(65) Prior Publication Data

US 2022/0029031 A1 Jan. 27, 2022

(30) Foreign Application Priority Data

Jul. 21, 2020 (EP) .................................... 20187055

(51) Int. Cl.
*H10D 89/00* (2026.01)
*H10D 1/43* (2025.01)
*H10D 64/00* (2025.01)
*H10D 89/60* (2025.01)

(52) U.S. Cl.
CPC ............ *H10D 1/43* (2025.01); *H10D 64/118* (2025.01); *H10D 89/601* (2025.01); *H10D 89/811* (2025.01)

(58) Field of Classification Search
CPC ............ H01L 29/8605; H01L 27/0251; H01L 27/0266; H01L 29/408; H01L 21/82; H01L 27/0288; H01L 27/0296; H10D 1/43; H10D 64/118; H10D 89/601; H10D 89/811; H10D 84/01; H10D 89/911; H10D 89/931
USPC ........................................................ 257/355
See application file for complete search history.

(56) References Cited

U.S. PATENT DOCUMENTS 5,451,799 A * 9/1995 Kurimoto ......... H01L 29/41758 257/241
5,998,832 A * 12/1999 Sheu .................... H10D 30/027 257/314
6,084,272 A * 7/2000 Jung .................... H10D 89/811 257/355
6,358,781 B1 * 3/2002 Lee ..................... H01L 27/0266 257/107
6,724,592 B1 * 4/2004 Tong ................... H01L 27/0266 361/111

(Continued)

OTHER PUBLICATIONS

Extended European Search Report and Written Opinion for corresponding European application 20187055.7, dated Jan. 28, 2021, 7 pages.

*Primary Examiner* — Sheikh Maruf
(74) *Attorney, Agent, or Firm* — Ruggiero McAllister & McMahon LLC

(57) ABSTRACT

A electrostatic discharge protection semiconductor structure is provided that includes a first protection stage, a second protection stage, and an inversion layer resistor arranged between the first protection stage and the second protection stage. The inversion layer resistor includes a p-doped substrate, a first n+-diffusion and a second n+-diffusion in the p-doped substrate, an inversion layer that is connecting the first n+-diffusion and the second n+-diffusion, and an oxide layer that covers the area between the first n+-diffusion and the second n+-diffusion.

20 Claims, 7 Drawing Sheets

(56) References Cited

U.S. PATENT DOCUMENTS 6,784,496 B1* 8/2004 Brodsky ............ H01L 27/0266 257/355
6,921,950 B2* 7/2005 Tatehara ............ H01L 27/0266 361/111
7,227,730 B2 6/2007 Litwin et al.
7,978,450 B1* 7/2011 Perisetty ............ H02H 9/046 361/118
9,437,591 B1* 9/2016 Nidhi ............ H01L 27/0262
9,450,402 B1* 9/2016 Huang ............ H02H 9/041
2001/0006243 A1* 7/2001 Morishita ............ H10D 89/601 257/360
2004/0124511 A1* 7/2004 Li ............ H05K 1/0212 257/678
2004/0190209 A1* 9/2004 Jozwiak ............ H01L 27/0251 361/56
2004/0262689 A1* 12/2004 Chen ............ H01L 27/0266 257/355
2005/0224946 A1* 10/2005 Dutta ............ G02B 6/12002 257/686
2006/0018066 A1* 1/2006 Litwin ............ H01L 27/0288 361/56
2006/0022274 A1* 2/2006 Hasegawa ............ H10D 89/811 257/350
2006/0050451 A1* 3/2006 Jen-Chou ............ H02H 9/046 361/56
2006/0175629 A1* 8/2006 Jumpertz ............ H10D 18/00 257/107
2006/0268474 A1* 11/2006 Huang ............ H10D 89/601 361/56
2007/0236847 A1* 10/2007 Jiang ............ H03K 19/00315 361/91.1
2008/0013231 A1* 1/2008 Bazzano ............ H01L 27/0259 361/56
2008/0128818 A1* 6/2008 Chen ............ H01L 29/0847 257/362
2008/0218920 A1* 9/2008 Vanysacker ............ H01L 27/0251 361/56
2009/0315112 A1* 12/2009 Lee ............ H10D 84/0158 257/E21.409
2010/0232126 A1* 9/2010 Maeda ............ H01G 4/232 361/760
2011/0051298 A1* 3/2011 Lai ............ H01L 27/0266 361/56
2012/0146150 A1* 6/2012 Gauthier, Jr. ............ H01L 23/60 257/E21.409
2012/0275072 A1* 11/2012 Chen ............ H01L 27/0262 361/56
2013/0063843 A1* 3/2013 Chen ............ H01L 23/49811 361/56
2013/0115399 A1* 5/2013 Roberts ............ B32B 7/10 428/36.5
2014/0133056 A1* 5/2014 Chung ............ H10D 10/60 361/56
2016/0064374 A1* 3/2016 Snowdon ............ H01L 27/0266 257/363
2017/0133840 A1* 5/2017 Loiseau ............ H02H 9/046
2017/0294432 A1* 10/2017 Park ............ H10D 89/611
2018/0240673 A1* 8/2018 Fukasaku ............ H01L 21/28105
2018/0269877 A1* 9/2018 Stroud ............ H02M 3/07
2018/0323183 A1* 11/2018 Chen ............ H10D 89/711
2018/0352330 A1* 12/2018 Mucha ............ H04R 3/007
2019/0109563 A1* 4/2019 Lin ............ H03B 5/364
2019/0131294 A1* 5/2019 Liu ............ H10D 1/47
2020/0136382 A1* 4/2020 Delshadpour ............ H01L 27/0248
2020/0373291 A1* 11/2020 Bakalski ............ H05K 9/0067
2021/0234362 A1* 7/2021 Bouche ............ H02H 3/033
2021/0257291 A1* 8/2021 Ishihara ............ H10B 12/50
2022/0208753 A1* 6/2022 Peng ............ H10D 8/80

* cited by examiner

ELECTROSTATIC DISCHARGE PROTECTION SEMICONDUCTOR STRUCTURE AND A METHOD OF MANUFACTURE

CROSS REFERENCE TO RELATED APPLICATION

This application claims the benefit under 35 U.S.C. § 119(a) of European Application No. 20187055.7 filed Jul. 21, 2020, the contents of which are incorporated by reference herein in their entirety.

BACKGROUND OF THE DISCLOSURE

1. Field of the Disclosure

The present disclosure relates to an electrostatic discharge protection semiconductor structure and a method of forming an electrostatic discharge protection semiconductor structure. The disclosure also relates to an integrated circuit comprising an electrostatic discharge protection semiconductor structure.

2. Description of the Related Art

A known monolithically integrated electrostatic discharge (ESD) protection device is described in U.S. Pat. No. 7,227,730.

Such a monolithically integrated ESD protection device is schematically shown in FIG. 1*a*. The monolithically integrated ESD protection device comprises a lateral field effect transistor structure, for example with a MOS gate structure. The device further comprises a high impedance biasing circuit 8. The device operates as a varistor for current limitation purposes.

The monolithically integrated ESD protection device is interconnected between input/output terminal of a high frequency or radio frequency MOS circuit 1 one side, and input/output bonding pad 2 from other side.

The lateral MOS transistor based varistor structure is formed in a p-type doped substrate 11. The lateral MOS transistor based varistor structure comprises an n-type doped well region 12, a gate region 13 including a silicon gate layer region 14 and a gate oxide layer region 15 arranged on top of the n-type doped well region 12. An electrically insulating sidewall spacer 16 is formed on each side of the gate region 13 to avoid short-circuiting of the structure. Heavily n+-type doped source and drain regions 17 are formed in the n-type doped well region 12 at a respective side of the gate region 13. One of the drain and source regions 17 is connected to the input/output bonding pad 2, and the other one of the drain and source regions 17 is connected to the input/output terminal of the MOS circuit 1.

The MOS transistor structure may include one or two lightly doped drain and/or pocket regions 18 as are commonly formed for MOS transistors. The resistance path between the drain and source regions 17 is schematically indicated by reference numeral 19.

The high impedance biasing circuit 8 is connected to the silicon gate layer region 14 and should have an impedance at the operating frequency, which is higher or much higher than the impedance of the capacitance associated with the gate oxide layer region 15, thus reducing the parasitic load on the input/output of the MOS circuit 1.

In this way the varistor shown in FIG. 1 is arranged to increase the resistance between the drain and source regions

17 at high voltages, e.g. at a voltage higher than normal operating voltages of the semiconductor device, to thereby limit a potentially damaging current from the input/output bonding pad 2 to the input/output of the circuit 1, or a similar current in an opposite direction.

It shall be noted that the ESD protection is mainly intended to be present during handling of the semiconductor device, i.e. when it is not connected to electrical power. Nevertheless, a current limitation operation is also present when the gate layer region 14 is biased.

At normal operating voltages of the semiconductor device, an accumulation region is created below the gate region by means of the biasing of the gate layer region 14 of the field effect transistor structure, thus decreasing actively the varistor series resistance.

The disadvantage of the monolithically integrated ESD protection device as described above is that the voltage drop across the varistor is due to the non-linear resistance of a low doped region. Such a device does not show the saturation effect of an inversion layer. Such a low doped resistor will show an avalanche breakdown for high voltages too. This is a so-called 'second breakdown' because it happens in a n+/n−/n+ structure. There is a strong risk that the device gets damaged when said 'second breakdown' occurs.

Another known embodiment for the ESD protection is presented in FIG. 1*b*. In this case the voltage-controlled non-linear resistors (varistors) are used as a serial impedance. The result is a low serial impedance for normal working conditions, thus, not hampering data transfer through the line, and a high impedance for over-voltage conditions. Such solutions are either not robust or add capacitive load to the data line via the control gate used for switching from low to high impedance. Therefore, their use is limited to low-data-rate signal lines where the restrictions concerning the allowable parasitic load for the signal line are relaxed.

SUMMARY

Various example embodiments are directed to the disadvantage as described above and/or others which may become apparent from the following disclosure.

According to an embodiment of this disclosure an electrostatic discharge protection semiconductor structure comprises:

- a first protection stage,
- a second protection stage, and
- an inversion layer resistor arranged between the first protection stage and the second protection stage.

Such an electrostatic discharge protection semiconductor structure can be arranged in an integrated circuit for providing an advantageous electrostatic discharge protection. It secures that integrated circuit cannot be damaged when a 'second breakdown' occurs.

According to an embodiment of this disclosure the inversion layer resistor comprises:

- a p-doped substrate, and
- a first n+-diffusion and a second n+-diffusion in the p-doped substrate.

The inversion layer resistor further comprises an inversion layer that is connecting the first n+-diffusion and the second n+-diffusion. The inversion layer comprises an oxide layer that covers the area between the first n+-diffusion and the second n+-diffusion.

The terminals of the inversion layer are positioned at the first n+-diffusion and the second n+-diffusion and these terminals are connected to the first protection stage and the second protection stage.

According to an embodiment of the disclosure the inversion layer can be created by the oxide charges of the oxide layer.

In an embodiment of the disclosure an electrostatic discharge protection semiconductor structure comprises an inversion layer resistor, wherein the inversion layer resistor comprises:

a p-doped substrate, a first n+-diffusion and a second n+-diffusion in the p-doped substrate, and a depletion mode MOS transistor arranged between the first n+-diffusion and the second n+-diffusion.

The depletion mode MOS transistor can comprise a gate and a back-gate, wherein the gate and the back-gate are connected to each other.

In an embodiment of the disclosure an integrated circuit comprises an electrostatic discharge protection semiconductor structure as specified in the previous embodiments.

The disclosure also includes the embodiments of creating an electrostatic discharge protection semiconductor structure as specified in the previous embodiments and embodiments of creating an integrated circuit comprising an electrostatic discharge protection semiconductor structure as described in the previous embodiments.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

DETAILED DESCRIPTION

Figure 2:
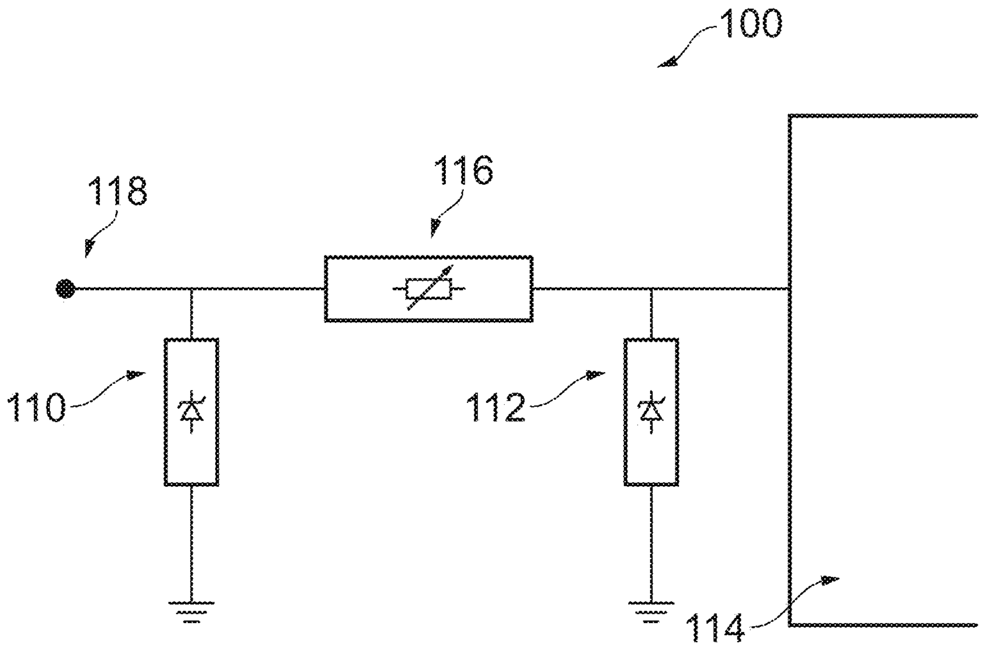
FIG. 2 illustrates a semiconductor device according to an embodiment of the disclosure.

FIG. 2 illustrates an embodiment of the present disclosure with a two stage ESD protections structures. Such two stage ESD protection structures can be either built fully on-chip or consisting of an off-chip protection device in combination with the on-chip protection structure. The two structures provide low ohmic current paths to supply lines in combination with an impedance 116 that forms part of the data line.

A two stage ESD protections structure device comprises the first stage protection device 110 and the in-line impedance 116. The second stage 112 can be an input ESD protection structure of the integrated circuit to be protected wherein reference 114 is used to show a core of such an integrated circuit.

In this embodiment the stress current is divided between the first stage 110 and the second stage 112 following Kirchhoff's rules, which rules are known to a skilled person.

This embodiment secures that the clamping voltage of the second stage 112 is reduced. This clamping voltage is limited by the allowed voltage of the core of the integrated circuit 112 to be protected. The clamping voltage at the second stage 112 depends on the current through the second stage 112. Therefore, it is important to minimize the current through the second stage 112. This can be achieved by increasing the serial impedance 116. From other side the data transfer restrictions limit the allowed value of the serial impedance 116.

Figure 3:
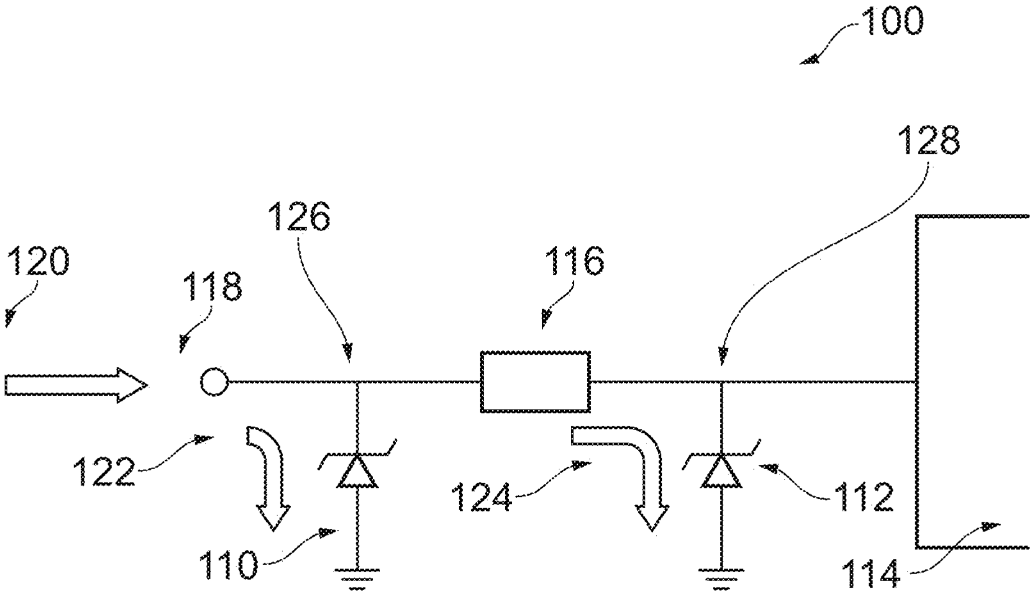
FIG. 3 illustrates a semiconductor device according to an embodiment of the disclosure.

FIG. 3 illustrates an embodiment of the present disclosure with a two stage ESD protections structures wherein the current distribution is shown. The stress current 120 is divided between the current through the first stage 122 and the current through the second stage 124. The current through the first stage 122 and the first stage 110 define the first clamping voltage V1. The current through the second stage 124 and the second stage 112 define the second clamping voltage V2. As said previously the second clamping voltage V2 is low so that the integrated circuit is ESD protected.

According to an embodiment of the disclosure a robust current limiting device is provided, wherein such a device can be placed into the signal line and it does not add to the capacitive load of the line.

According to the embodiment of the disclosure an inversion layer resistor is used. In this case, due to the pinch-off effect of the inversion layer, that gives rise to current saturation, increasing the voltage drop along the layer does not increase the current.

Under normal conditions, e.g. during the data transfer mode, the inversion layer resistor, when designed with a sufficient width-length ratio, it shows ohmic behaviour. The resistance can be designed to be small enough, e.g. less than 1 Ohm, and it will therefore not hamper data transfer.

Under stress conditions the inversion layer resistor will show current saturation, thus limiting the current that reaches the second stage protection shunt. If the clamping voltage V1 126 at the first stage 110 exceeds the breakdown voltage of the transistor that form the contacts for the inversion layer resistor, more current may flow to the second stage 112. But the current through the second stage 124 will still be reduced, because the breakdown voltage of the transistor adds to the total voltage drop of the second current path 124. This reduction will be improved if the breakdown voltage of the transistor is chosen high enough.

No control gates or trigger circuits are necessary for such an inversion layer resistor. Therefore, the capacitive load of the signal line is not influenced, and the signal transfer is not hampered.

The combination of current-limiting capability and capacitive-neutral insertion makes the device useful for the ESD and/or surge protection of high-rate data inputs/outputs of modern integrated circuits.

Figure 4:
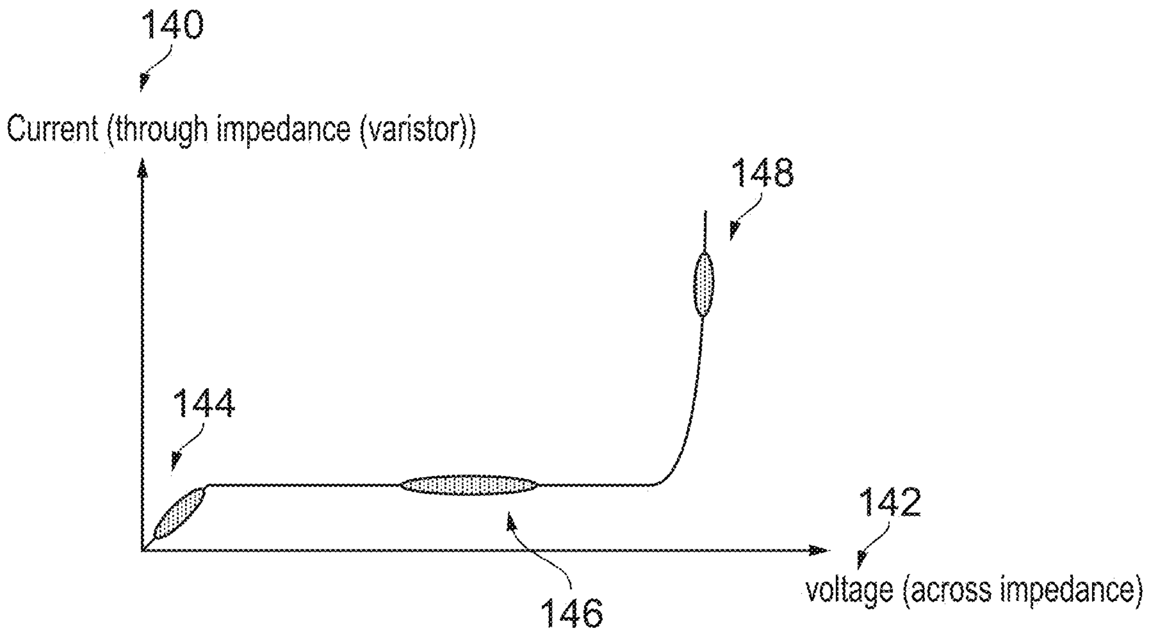
FIG. 4 illustrates a voltage-current dependency for a semiconductor device according to an embodiment of the disclosure.

The dependence of the current through impendence 140, i.e. varistor, on the voltage across impendence 142 is shown in FIG. 4. For the lower voltages 144 the curve represents an ohmic behaviour. After that there is the current limitation by saturation 146. The last part represents the clamping voltage of an open base transistor in a breakdown 148.

An inversion according to an embodiment of the disclosure can be produced by combining fixed oxide charges with low p-doping level.

Figure 5:
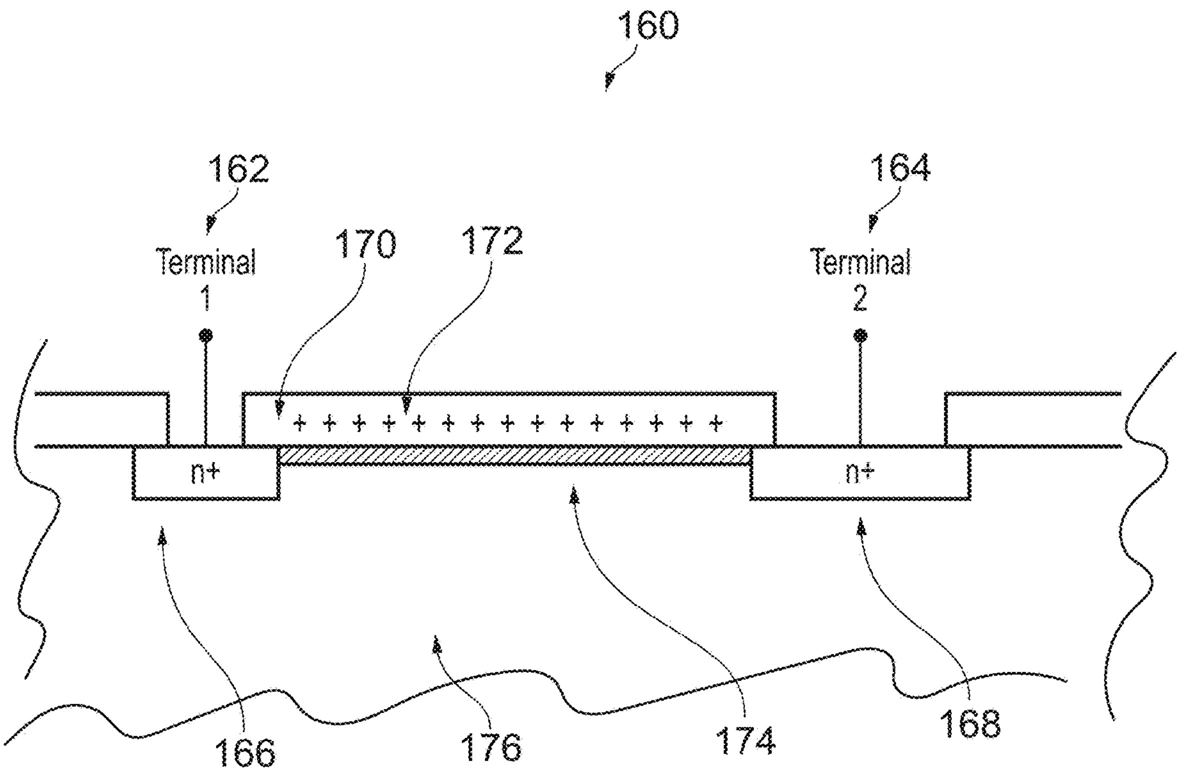
FIG. 5 illustrates a semiconductor device according to an embodiment of the disclosure.

An embodiment of the disclosure is shown in FIG. 5. A device 160 comprises two terminals, a first terminal 162 and a second terminal 164. The first terminal and the second terminal are connected to a first n+ diffusion 166 and to a second n+ diffusion 168 respectively, which the first n+ diffusion 166 and the second n+ diffusion 168 are provided in a lowly p-doped substrate 176.

The first n+ diffusion 166 and the second n+ diffusion 168 are connected by an inversion layer 174, created by oxide charges 172 in the oxide layer 170 that covers the area between the first n+ diffusion 166 and the second n+ diffusion 168.

Figure 1A:
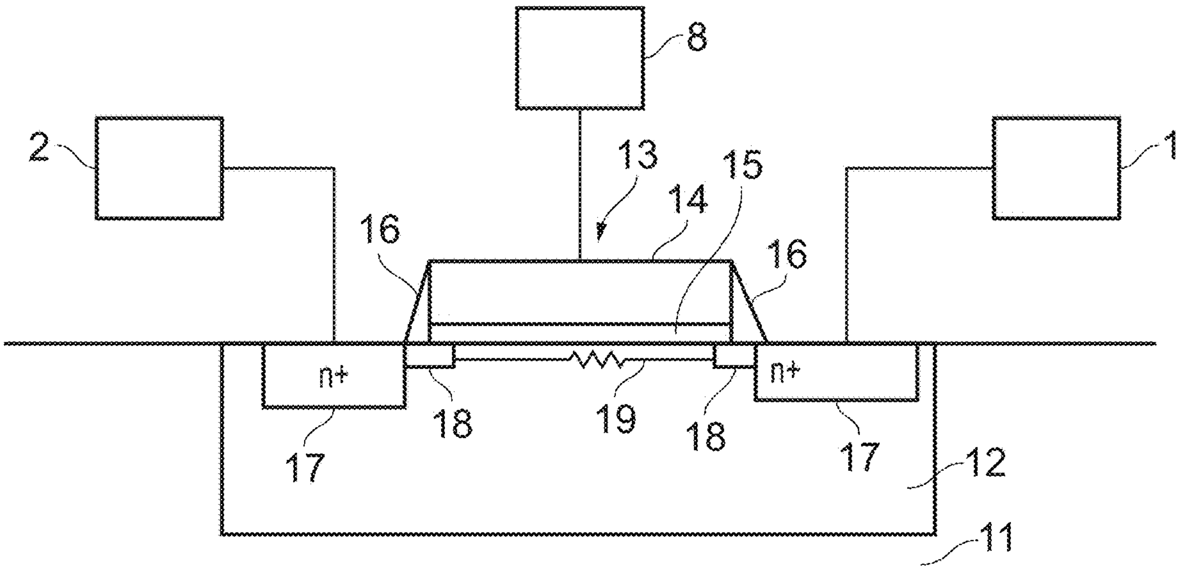
FIG. 1a (Prior Art)
FIGS. 1*a* and 1*b* show a known monolithically integrated ESD protection device and a known embodiment for the ESD protection, respectively.
Figure 1B:
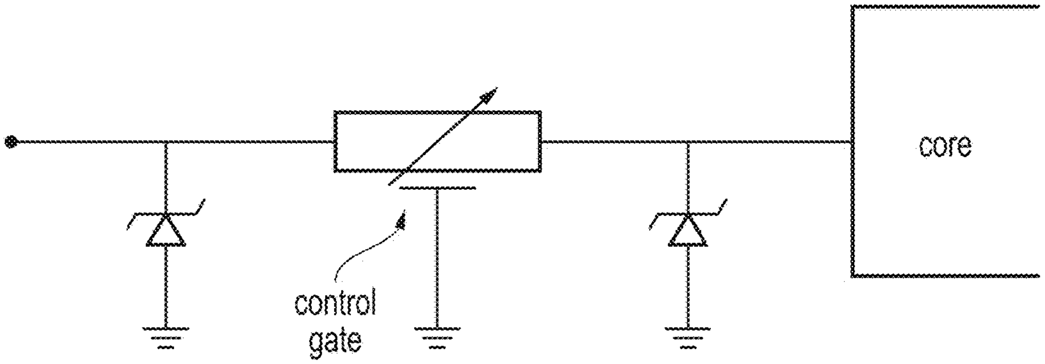
FIG. 1b (Prior Art)

The above described device with its two terminals 162 and 164 is placed into the signal line between two protection devices 110 and 112, as shown in FIG. 2, and it is placed where the 'impedance' 116 is shown in FIG. 1.

The two contact diffusions, the first n+ diffusion 166 and the second n+ diffusion 168, form an open-base transistor together with the p-doped substrate 176. As described above, this transistor might be driven into breakdown mode if the clamping voltage at the first protection stage 110 surpasses the trigger voltage. This parallel current path, parallel to the current limited inversion layer resistor, that has no obvious current limitation is advantageous for the protection of the second stage 112 protection device. The breakdown voltage of this transistor, which is normally above 20 Volt, adds to the total voltage of the second path, still reducing drastically the current 124 through the second stage 112. Further, this parallel current path protects the inversion layer resistor from being damaged by a too high voltage drop across the inversion layer resistor. This improves the robustness of the device in case of overvoltage/overcurrent stress pulses.

Figure 6:
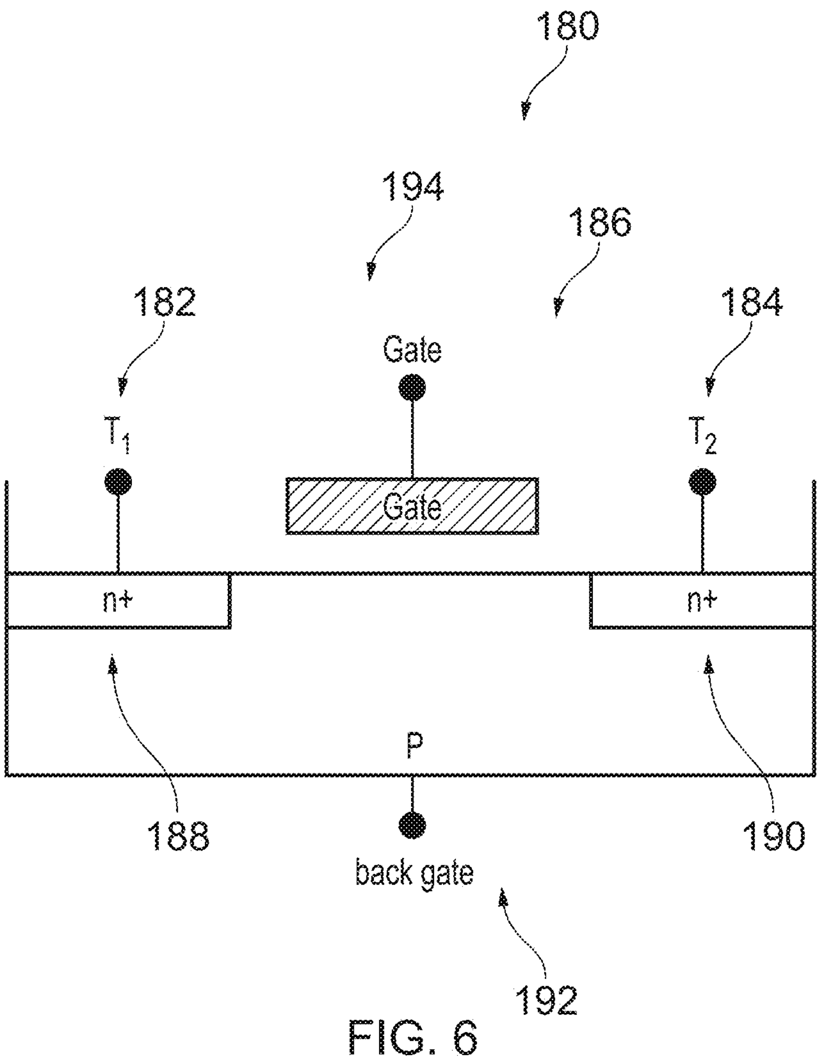
FIG. 6 illustrates a semiconductor device according to an embodiment of the disclosure.

An embodiment of the disclosure is shown in FIG. 6. A device 180 comprises a depletion mode MOS transistor 194. The depletion mode MOS transistor has an inversion layer below the gate even at zero voltage difference between the gate 186 and the back-gate 192.

In general, a MOS transistor is basically a four-terminal device, it comprises two input/output terminals, a first terminal 182 and a second terminal 184. The MOS transistor further comprises a gate terminal 186 and a back-gate terminal 192. If the voltage between the gate terminal 186 and the back-gate terminal 192 is larger than the threshold voltage of the specific transistor an inversion layer below the gate terminal 186 will connect the first terminal 182 and the second terminal 184.

In an embodiment of the disclosure the depletion mode MOS transistor 194 is placed into the signal line, the first terminal 182 and the second terminal 184 are connected to either side of the signal line.

Figure 7:
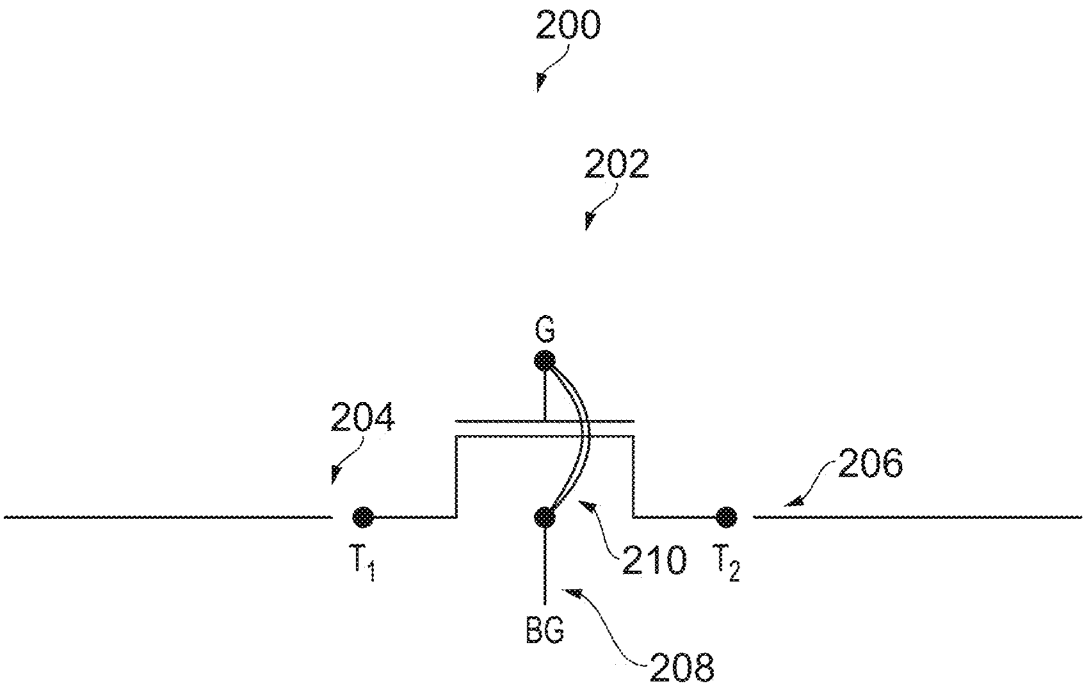
FIG. 7 illustrates a semiconductor device according to an embodiment of the disclosure.

As shown in an embodiment of the disclosure in FIG. 7, for the depletion mode MOS transistor 200, this means that the inversion layer will connect the first terminal 204 and the second terminal 206 even if the voltage difference between the gate terminal 202 and the back-gate terminal 208 is zero.

When the gate terminal 202 and the back-gate terminal 208 are shorted 210 together, the depletion mode MOS transistor is in the conduction mode.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. An electrostatic discharge protection semiconductor structure comprising:
- an inversion layer resistor arranged to secure electrostatic discharge protection without the need for a control gate or a trigger circuit.

2. The electrostatic discharge protection semiconductor structure as claimed in claim 1, wherein the electrostatic discharge protection semiconductor structure further comprises:
- a first protection stage; and
- a second protection stage,
- wherein the inversion layer resistor is arranged between the first protection stage and the second protection stage.

3. The electrostatic discharge protection semiconductor structure as claimed in claim 1, wherein the inversion layer resistor further comprises:
- a p-doped substrate; and
- a first n+-diffusion and a second n+-diffusion in the p-doped substrate, and
- an inversion layer that is connecting the first n+-diffusion and the second n+-diffusion.

4. The electrostatic discharge protection semiconductor structure as claimed in claim 2, wherein the inversion layer resistor further comprises:
- a p-doped substrate;
- a first n+-diffusion and a second n+-diffusion in the p-doped substrate; and
- an inversion layer that is connecting the first n+-diffusion and the second n+-diffusion.

5. The electrostatic discharge protection semiconductor structure as claimed in claim 3, further comprising an oxide layer that covers the area between the first n+-diffusion and the second n+-diffusion.

6. The electrostatic discharge protection semiconductor structure as claimed in claim 3, wherein the inversion layer is created by oxide charges in an oxide layer on top the inversion layer resistor.

7. The electrostatic discharge protection semiconductor structure as claimed in claim 4, wherein the inversion layer is created by oxide charges in an oxide layer on top the inversion layer resistor.

8. The electrostatic discharge protection semiconductor structure as claimed in claim 5, wherein the inversion layer is created by oxide charges in an oxide layer on top the inversion layer resistor.

9. The electrostatic discharge protection semiconductor structure as claimed in claim 2, wherein the inversion layer resistor further comprises:

a p-doped substrate;

a first n+-diffusion and a second n+-diffusion in the p-doped substrate; and a depletion mode MOS transistor arranged between the first n+-diffusion and the second n+-diffusion.

10. The electrostatic discharge protection semiconductor structure as claimed in claim 9, wherein the depletion mode MOS transistor further comprises a gate and a back-gate, and wherein the gate and the back-gate are connected to each other.

11. An integrated circuit comprising an electrostatic discharge protection semiconductor structure as claimed in claim 1.

12. An integrated circuit comprising an electrostatic discharge protection semiconductor structure as claimed in claim 2.

13. An integrated circuit comprising an electrostatic discharge protection semiconductor structure as claimed in claim 3.

14. A method of creating an electrostatic discharge protection semiconductor structure comprising:

forming an inversion layer resistor arranged to secure electrostatic discharge protection without the need for a control gate or a trigger circuit.

15. A method of creating an electrostatic discharge protection semiconductor structure as claimed in claim 14, further comprising:

a first protection stage; and a second protection stage, wherein the inversion layer resistor is arranged between the first protection stage and the second protection stage.

16. A method of creating an electrostatic discharge protection semiconductor structure semiconductor as claimed in claim 15, wherein the inversion layer resistor further comprises:

a p-doped substrate; and a first n+-diffusion and a second n+-diffusion in the p-doped substrate, and an inversion layer that is connecting the first n+-diffusion and the second n+-diffusion.

17. A method of creating an integrated circuit comprising an electrostatic discharge protection semiconductor structure comprising:

forming an inversion layer resistor arranged to secure electrostatic discharge protection without the need for a control gate or a trigger circuit.

18. A method of creating an integrated circuit comprising an electrostatic discharge protection semiconductor structure as claimed in claim 17, wherein the inversion layer resistor further comprises:

a first protection stage; and a second protection stage, wherein the inversion layer resistor is arranged between the first protection stage and the second protection stage.

19. A method of creating an integrated circuit comprising an electrostatic discharge protection semiconductor structure as claimed in claim 18, wherein the inversion layer resistor further comprises:

a p-doped substrate; and a first n+-diffusion and a second n+-diffusion in the p-doped substrate, and an inversion layer that is connecting the first n+-diffusion and the second n+-diffusion.

20. An electrostatic discharge protection semiconductor structure comprising:

an inversion layer resistor arranged to secure electrostatic discharge protection, wherein the inversion layer resistor further comprises:

a p-doped substrate;

a first n+-diffusion and a second n+-diffusion in the p-doped substrate, and an inversion layer that is connecting the first n+-diffusion and the second n+-diffusion comprising either an oxide layer that covers the area between the first n+-diffusion and the second n+-diffusion or a depletion mode MOS transistor arranged between the first n+-diffusion and the second n+-diffusion.

* * * * *